United States Patent [19]

Carroll et al.

[11] 4,267,443

[45] May 12, 1981

[54] PHOTOELECTRIC INPUT APPARATUS

[75] Inventors: Arthur B. Carroll, St. Joseph; Vladeta D. Lazarevich, Bondville; Mark R. Gardner, Champaign, all of Ill.

[73] Assignee: Carroll Manufacturing Corporation, Champaign, Ill.

[21] Appl. No.: 899,260

[22] Filed: Apr. 24, 1978

[51] Int. Cl.³ .............................................. G01V 9/04
[52] U.S. Cl. ................................... 250/221; 250/560
[58] Field of Search .............. 250/221, 222, 578, 209, 250/560; 324/178; 356/376–387

[56] References Cited

U.S. PATENT DOCUMENTS

| | | | |
|---|---|---|---|
| 3,180,995 | 4/1965 | Briggs et al. | 324/178 |
| 3,428,817 | 2/1969 | Hofmeister et al. | 250/222 R |
| 3,727,069 | 4/1973 | Crittenden et al. | 250/222 R |
| 3,764,813 | 10/1973 | Clement et al. | 250/221 |
| 3,860,754 | 1/1975 | Johnson et al. | |

Primary Examiner—David C. Nelms
Attorney, Agent, or Firm—Hill, Van Santen, Steadman, Chiara & Simpson

[57] ABSTRACT

A photoelectric touch input panel has a plurality of crossed light beams which are broken by an object, the position coordinates of which are identified as outputs. Two spaced apart beam surfaces are provided, and the interrelationship between the beams in the two planes is employed to distinguish between interrupting objects on the basis of their size, attitude, and velocity characteristics. The number of beams broken in any beam plane is counted to determine the relative size of the object, or to determine the center line of the interrupting object. The beams in any beam plane are selected in accordance with the relative significance of the various beams, and interrupted beams are pulsed more rapidly than non-interrupted beams. The light-emitting devices of the various beam planes are constructed as an integral unit. The control system of the touch input panel is adapted for use in monitoring the size, shape, and activity of objects within a space defined by plural beam planes, independently of the touch input panel.

27 Claims, 12 Drawing Figures

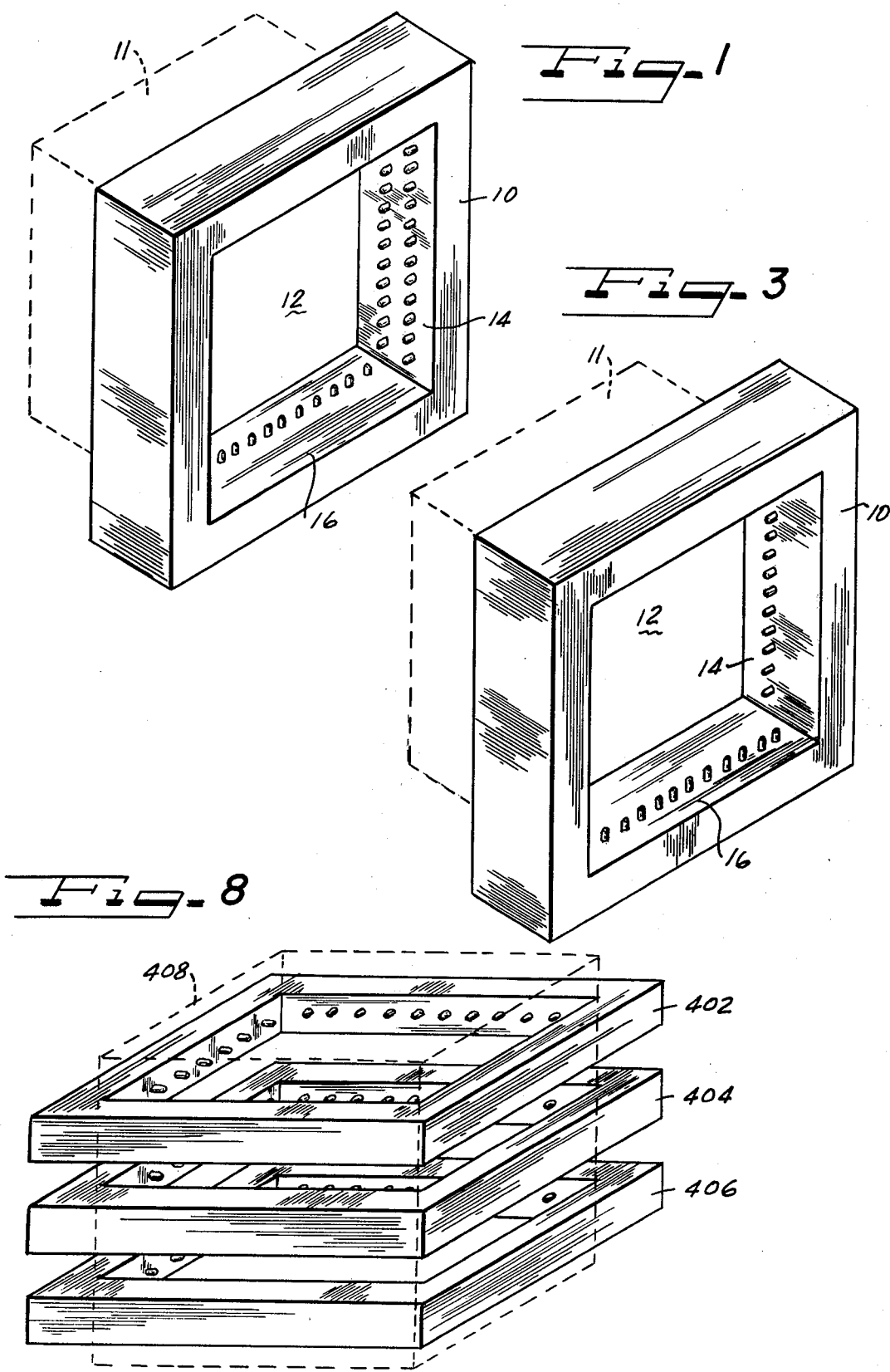

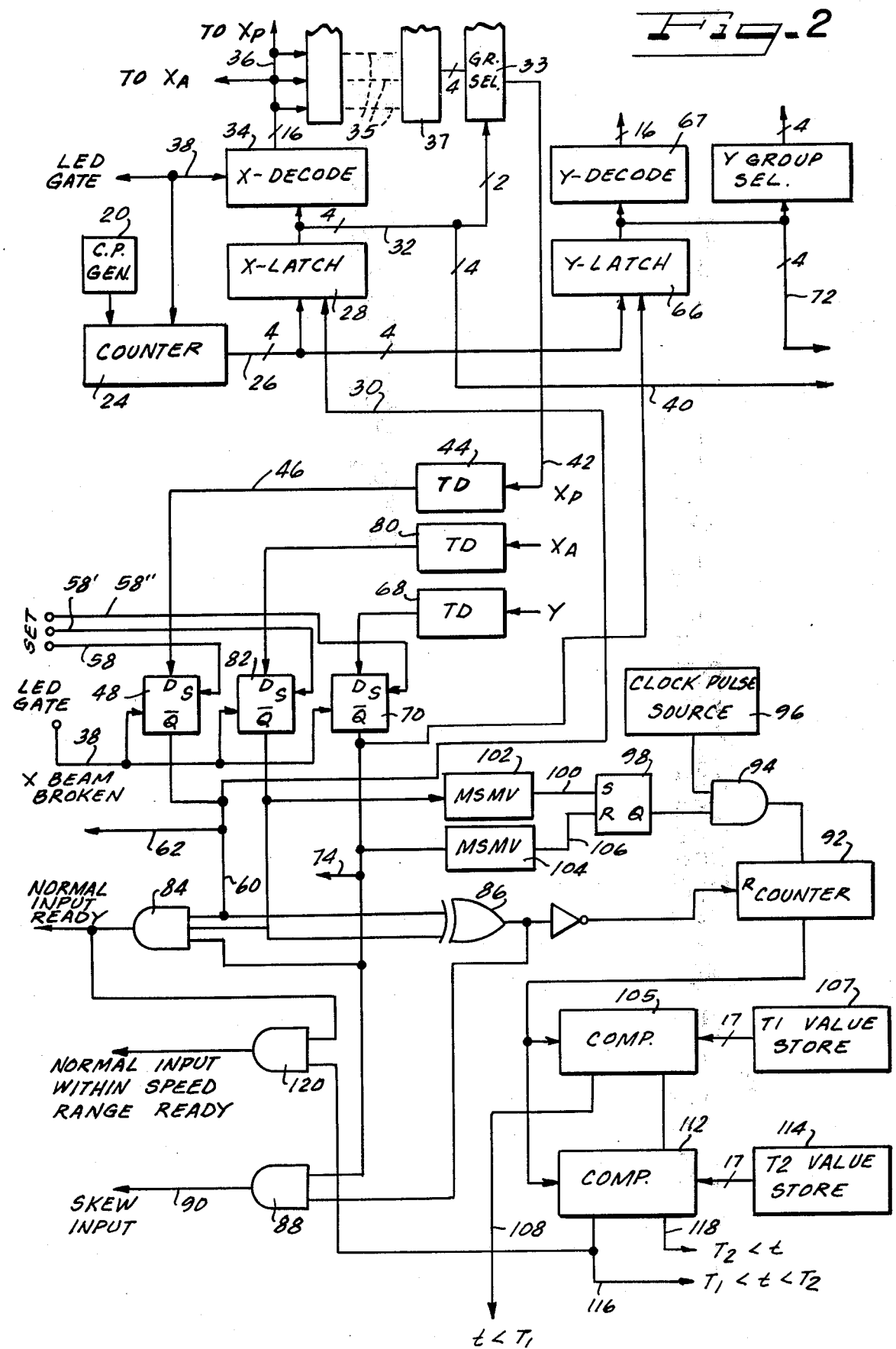

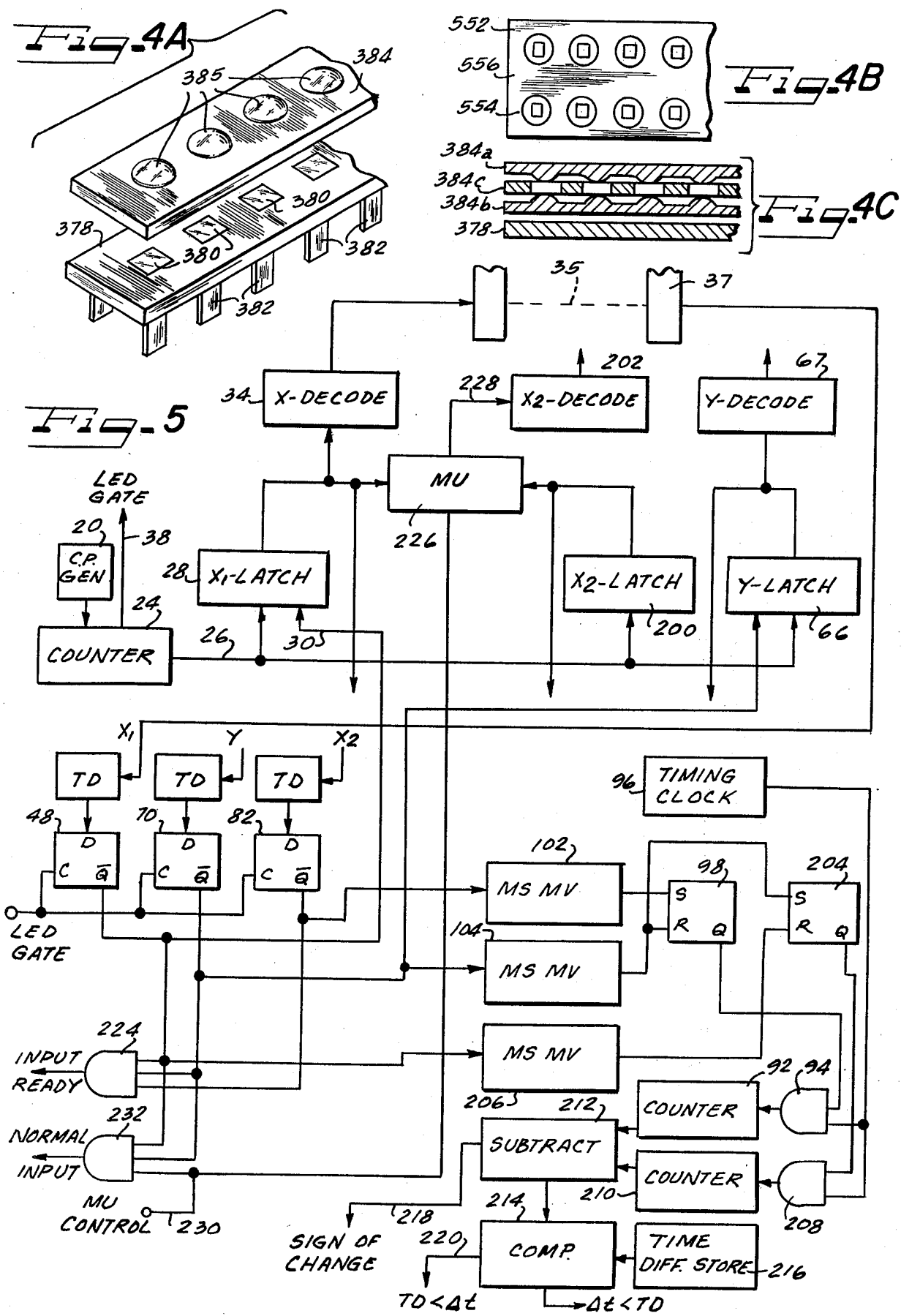

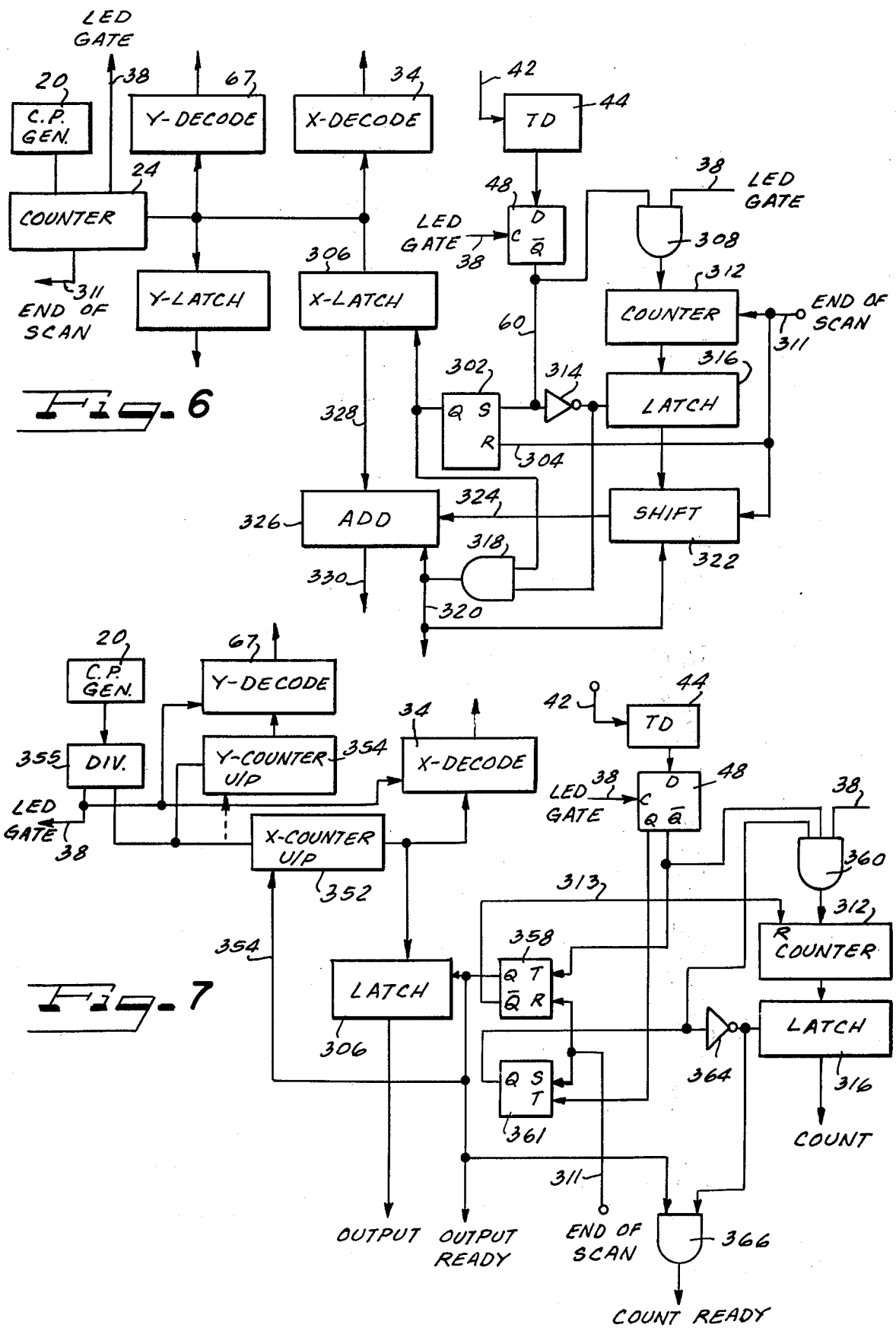

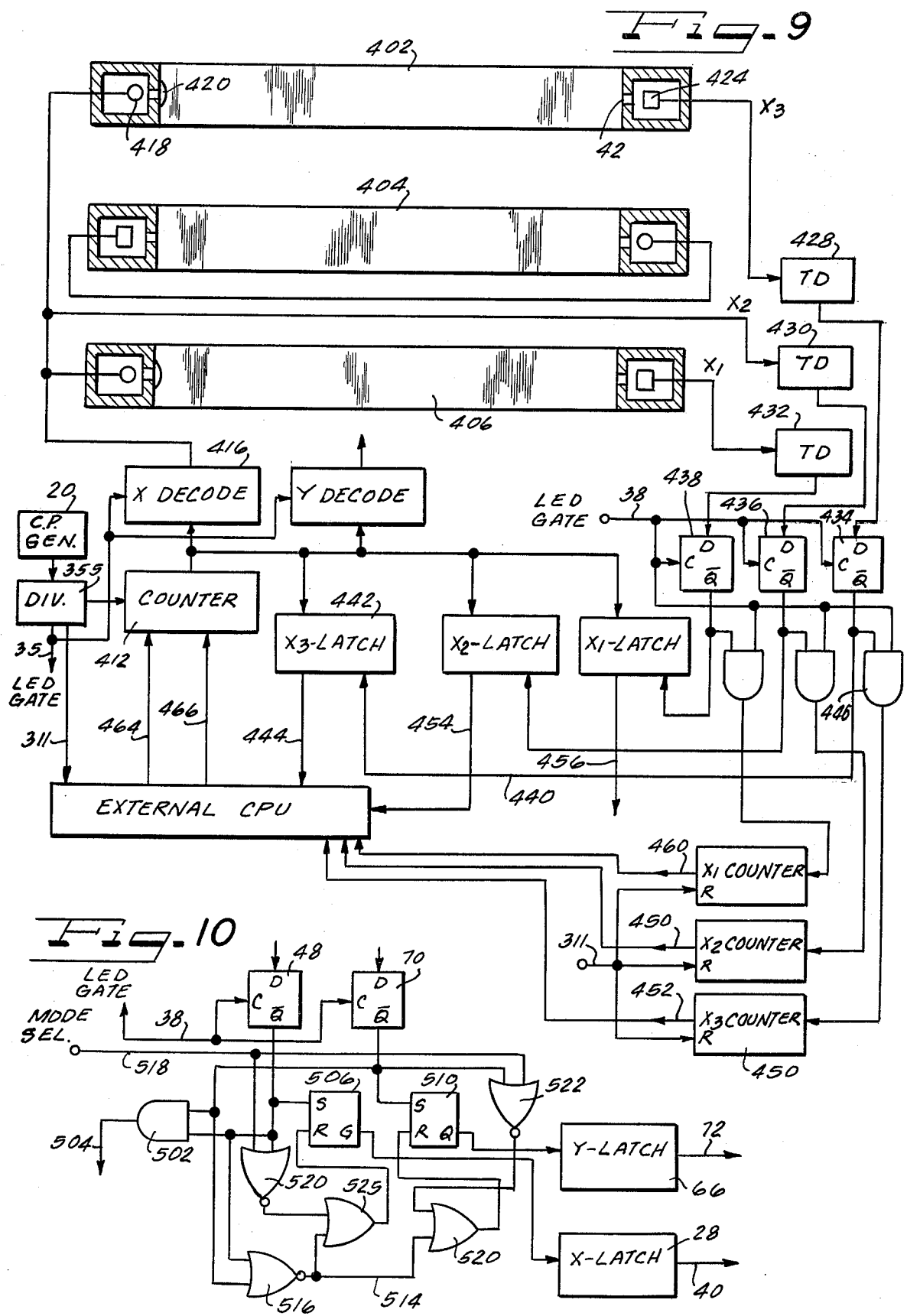

PHOTOELECTRIC INPUT APPARATUS

BACKGROUND

1. Field of the Invention

The present invention relates to photoelectric input apparatus; more particularly, to touch input panels having a series of crossed light beams, in which the interruption of a pair of crossed light beams identifies the position of an object in the plane.

2. The Prior Art

Photoelectric touch input panels have been developed which use a plurality of crossed light beams, arranged in sets of parallel beams in a single plane, to identify the approximate position of an object which breaks both of two crossing beams. Typically, such touch input panels are intended to be used in front of a display device such as a cathode ray tube, and the position of an operator's finger when it touches a spot on the cathode ray tube is detected by determining which two crossed beams are simultaneously interrupted. At times, the touch input panel is used with a stylus or other device in place of a finger. The resolution with which the position of the finger or stylus can be determined is dependent largely upon the spacing of the parallel beams in the beam plane and the width of the finger or stylus. The beams must be spaced apart by a distance which is small enough to insure breaking at least one beam by the smallest size finger or stylus, and, accordingly, it is frequently the case that multiple beams are broken. In previous touch input panels, the output is produced by an indication of the first beam which is recognized as being broken, scanning from one direction toward the other (for example, from the top down), and this results in determination of a position which is not the position corresponding to the center line of the finger or stylus. Accordingly, it is desirable to provide a way of determining the approximate center point of the finger or stylus if more than one of a series of parallel beams is broken.

In previous touch input panels, it is possible for a relatively small foreign object, such as an insect, a raindrop or debris, to cause a false indication of an input by passing through the beam plane. It is, therefore, desirable to provide a mechanism for discriminating against foreign objects which happen to pass through the beam plane of the device.

In previous touch input panels, a relatively complicated arrangement is required for controlling operation of the panel. It is desirable to simplify, as much as possible, the logic and electronic circuits required in the use of the panel to enable the panel to be produced with as much economy as possible, and to increase the reliability of the panel.

Previous touch input panels, while useful for determining the position of an object in a beam plane, are not capable of sensing any additional data relating to such input, such as the velocity of approach of the object toward the touch panel. It is sometimes desirable to be able to discriminate the velocity of approach of an object which intersects the beams in the beam plane, in order to insure with greater certainty that an actuation of the touch input panel is an intentional actuation by means of a finger or stylus, rather than an accidental operation. It is, therefore, also desirable to provide some means of sensing the velocity of approach of an object which intersects the beams and the beam plane.

Previous touch input panels are adapted to scan through the entire population of each set of beams on a sequential basis, and therefore each individual beam is scanned relatively infrequently. This establishes a time interval of uncertainty as to whether a beam is interrupted or not. It is desirable to reduce this time interval, and increase the scanning rate for one or more specific beams which are of greater significance, or which are more likely than others to be interrupted.

Previous touch panels are not well-adapted to operation in more than one mode. Typically, they operate in a point mode, in which points are identified by decoding the X-Y coordinates of a broken beam pair, without recognizing additional points which may be legitimate inputs until after a condition is recognized in which no beam is broken. It is desirable to avoid this limitation and permit multi-mode operation of the touch panel.

Previous touch panels have not been well-adapted to recognize and detect more than one pair of interrupted beams at a time, which severely limits the usefulness of the panel. It is desirable to provide an arrangement in which a number of interrupted crossed beam pairs are recognized. This makes it possible to use touch input panel control apparatus to perform a variety of tasks such as sizing, space monitoring, and protection interlock activities.

Previous touch panels have not been able to discriminate between touch inputs (by a finger or stylus) which move normally to the touch panel. It is desirable to be able to distinguish between normal or skew approaches, particularly in applications where high resolution of the touch input is required.

Previous touch panels have been required to use comparators for determining, in each beam plane, whether a beam detected as being interrupted is different from the last detected beam. It is desirable to provide an arrangement which makes the use of such comparators, and other associated logic, unnecessary.

SUMMARY OF THE INVENTION

It is a principal object of the present invention to provide a touch input panel with means for determining the approximate center point of an object which intersects more than one beam of a plurality of parallel spaced beams in a beam plane.

It is another object of the present invention to provide improved logic apparatus for decoding the position of an object which is detected within a beam plane.

Another object of the present invention is to provide means for sensing the presence of a finger or stylus or other elongated object, and distinguishing such object from an object of shorter dimensions.

A further object of the present invention is to provide means for determining the velocity of approach of an object which is detected within the beam plane, or a change in the velocity of the object during its approach.

Another object of the present invention is to provide means for selectively scanning particular beams with increased frequency relative to the scanning of the beams.

A further object of the present invention is to provide means for scanning interrupted beams more frequently than noninterrupted beams.

Another object of the present invention is to provide apparatus for enabling the control apparatus of the present invention to function selectively in a point mode or in a stream mode.

A further object of the present invention is to provide apparatus for enabling the control apparatus of the present invention to monitor plural pairs of crossed interrupted beams.

Another object of the present invention is to provide a plurality of beam planes and apparatus for counting the number of interrupted beams in each set of beams defining each beam plane.

A further object of the present invention is to provide apparatus for sizing objects within a space defined by a plurality of beam planes.

Another object of the present invention is to provide apparatus for monitoring activity within a space defined by a plurality of beam planes.

A further object of the present invention is to provide apparatus for monitoring specific locations within a space defined by a plurality of beam planes and for inhibiting operation of dangerous instrumentalities in response to detection of an interrupted beam pair at such location.

A further object of the present invention is to provide apparatus for detecting the approach of a finger or stylus toward a touch panel in a normal direction and discriminating against an angled approach.

A further object of the present invention is to provide an improved arrangement for mounting a plurality of LED's associated with a single beam plane.

In accordance with one embodiment of the present invention, there is provided a touch input panel having means for detecting when more than one beam of a series of parallel spaced beams in a beam plane are broken, means for counting the number of broken beams, and means responsive to the total broken beam count for increasing the resolution of the panel. In addition to the principal beam plane which has crossed X and Y beams, an auxiliary beam plane which incorporates a series of spaced parallel beams spaced from the principal beam plane is provided, and an elongated object, such as a finger or stylus, is sensed when there is a coincidence of intersection of two beams in the principal beam plane and at least one beam in the auxiliary beam plane. The difference in time between breaking the beams in the principal and auxiliary beam planes is employed to determine the velocity of the object as it approaches the beam plane, and this velocity can be used to discriminate between objects such as a finger or stylus and other objects which move either more slowly or more rapidly than a finger or stylus. A simple logic circuit is employed, which is economically and simply manufactured.

In another embodiment of the present invention, the control apparatus is employed to monitor activity within a space defined by plural beam planes.

These and other objects and advantages of the present invention will become manifest by an examination of the following description and the accompanying drawings.

BRIEF DESCRIPTION OF THE DRAWINGS

Reference will now be made to the accompanying drawings in which:

FIG. 1 is a perspective view of a portion of a housing of a touch input panel incorporating an exemplary embodiment of the present invention, illustrating devices associated with plural spaced crossed beams in a principal beam plane and plural spaced beams in an auxiliary beam plane;

FIG. 2 is a functional block diagram of a control system for the apparatus of FIG. 1, illustrating the apparatus for detecting and counting the number of broken beams, for detecting the coincidence of beam interruption in the principal and auxiliary planes, and for determining the velocity of approach of an object toward the principal beam plane;

FIG. 3 is a perspective view of an alternative embodiment of the present invention, incorporating spaced X and Y beam planes;

FIGS. 4a–4c are views of arrangements for mounting a plurality of LED's or phototransistors;

FIG. 5 is a functional block diagram of a control system for an alternative embodiment of the present invention having two X beam planes spaced on opposite sides of a Y beam plane;

FIG. 6 is a functional block diagram of a control system for a further embodiment of the present invention adapted for counting the number of consecutive interrupted beams in each beam plane and determining the address of the center line of the interrupting object;

FIG. 7 is a functional block diagram of another embodiment of the present invention adapted for scanning back and forth in each beam plane across an interrupting object, without scanning beam paths which are remote from the interrupting object;

FIG. 8 is a perspective view of another embodiment of the present invention adapted for monitoring a space defined by a plurality of beam planes;

FIG. 9 is a functional block diagram of a logic circuit used with the apparatus of FIG. 8; and FIG. 10 is a functional block diagram of a control circuit for enabling the apparatus of the present invention to be selected for stream mode or point mode operation.

Referring now to FIG. 1, there is illustrated in diagrammatic form a housing 10 which contains the control system for operating a touch input panel. The housing 10 has a central opening 12, and the housing 10 is adapted to be placed in relation to a display surface on the front of a display device 11, which may be a CRT or other display device, so that a display is visible in the opening 12. The opening 12 is bounded by two side walls 14 (one of which is shown in FIG. 1) and upper and lower walls 16. One of the side walls 14 is equipped with a plurality of light-emitting devices such s LED's or the like, and the opposite wall is equipped with a plurality of photosensitive devices such as phototransistors or the like. The phototransistors are aligned with the LED's and are adapted to receive light generated by the LED's. There is a lens provided for each of the LED's to collimate the light and focus it principally on one of the phototransistors on the opposite wall. The path between an LED and the phototransistor on the opposite wall upon which the LED's light is focused is referred to as a beam. There are a plurality of such beams which originate at one of the side walls 14 and terminate at the opposite side wall 14, and these beams are arranged in parallel spaced relationship so that a person or operator who touches a panel located behind the opening 12 will intercept one or more of the beams. The beams are arranged in a plane which is referred to as a beam plane.

A second set of spaced parallel beams extends between the upper and lower walls 16, with each of such beams having a light-generating LED at one end and a phototransistor at the other end. The beams extending between the side walls 14 are referred to herein as the X beams, and the beams extending between the upper and lower walls 16 are referred to as the Y beams. The X and Y beams may be oriented in any direction with respect to the horizontal and vertical. The plane of the X beams is referred to as the X beam plane, and the plane of the Y beams is referred to as the Y beam plane. When the X beam plane coincides with the Y beam plane, the plane is referred to as the principal plane.

In the apparatus of FIG. 1, a principal plane is formed near the rear of the opening 12, with crossing X beams and Y beams in that plane. An auxiliary X beam plane is spaced forwardly of the principal plane, near the front of the opening 12. Its plane is referred to as the auxiliary plane. The location of the principal plane is identified in FIG. 1 by the apertures in the lower wall 16 and the rearward line of apertures in the side wall 14. The foward line of apertures in the side wall 14 defines the auxiliary plane. The auxiliary plane is spaced far enough from the principal plane so that a small foreign object which happens to be present in the opening 12 cannot intercept beams in both the principal plane and the auxiliary plane. Coincidence of principal and auxiliary beam interruption can, therefore, be used to confirm that an interrupted beam is not caused by a small foreign object. This feature is of particular value when the invention is used in environments such as aircraft cockpits, outdoor terminals, etc.

Foreign objects (such as insects) which are large enough to break beams in both the principal and auxiliary planes simultaneously can be discriminated against on the basis of their characteristic velocity of approach toward the principal beam plane, as described hereinafter. This is accomplished by determining the time interval between a beam interruption in the auxiliary plane and a beam interruption in the principal plane, and inhibiting device from recognizing a valid input unless that interval conforms to prescribed values.

The X beams in the auxiliary plane are horizontally aligned with the X beams in the principal plane. This fact is made use of in order to require that corresponding X beams in both the principal and auxiliary planes are interrupted simultaneously in order to recognize a valid input. This requires an operator to touch the panel at the front of the display device 11 in such a way that his finger or stylus extends generally normally to the panel, as far as the X beams are concerned. By discriminating against inputs which interrupt non-corresponding X beams in the principal and auxiliary planes, the apparatus is able to discriminate against fingers or styli which approach the panel in an oblique direction as far as the X beams are concerned. Since the only set of Y beams is in the principal plane, the finger or stylus may approach the panel at any angle which simultaneously intercepts corresponding X beams. If a higher degree of normality is desired, a second set of Y beams can be provided spaced from the principal plane in order to make the same coincidence requirement for the Y beams as has been described above in connection with the X beams. When an extra Y beam plane is provided, it is desirable to space it from both the principal plane and the auxiliary X plane, so that three planes are provided. Noting the time difference of beam interruption in each of the three planes permits a determination of a change in the velocity as a finger or stylus approaches the panel. In other words, the time difference between interception of beams in the first two beam planes is a function of the average velocity in that space, and the time difference between interruption of the beams in the second and third beam planes is a function of the average velocity in that space. The determination of the average velocities in two adjacent spaces permits an identification of certain types of movement of the operator's finger or stylus. This may be used as an additional input from the touch input panel, and is at times very significant. For example, if the velocity of a finger decreases more than usual as it approaches the panel, it may indicate a degree of uncertainty on the part of the operator as to what part of the panel is to be touched. Recognition of this fact may be employed to select an appropriate program for the circumstance. For example, when the touch input panel is employed with a programmed learing device, one subsequent program may be selected when the response indicated by the touch input is correct and certain, and a different program may be selected when the touch input is correct, but hesitant.

Referring to FIG. 3, an alternative embodiment of the present invention is illustrated. In the embodiment of FIG. 3, there is one set of X beams and one set of Y beams, which have been separated so that there is no principal plane. The separation of the X and Y beam planes permits the apparatus to discriminate against small insects, and to calculate the difference in time between interruption of the beams in the two auxiliary planes. It is not capable of requiring that inputs be made in a direction normal to the panel, as is the apparatus of FIG. 1, but has the advantage of greater simplicity.

Referring now to FIG. 2, there is shown a functional block diagram illustrating a control system which may be used with the apparatus of FIG. 1.

A clock pulse generator 20 is provided which produces repetitive pulses. The pulses produced by the generator 20 advance a counter 24, which functions as a scan counter for the X and Y beams. It is a binary counter and in the illustration of FIG. 2 is a multi-stage counter. The output lines 26 from four stages of the counter 24 are four in number, as identified by the slash and the numeral 4. A larger counter (having six or more stages, for example) may be used for larger panels and when greater resolution is desired. The lines 26 are connected to four input terminals of a latch unit 28, which functions to latch the data presented on the lines 26 when a latch signal appears on a line 30. The latch outputs of the latch unit 28 are presented on a group of four lines 32 to a decode unit 34, which has sixteen output lines 36 connected to individual LED's on one of the side walls 14, to generate the X beams 35. A gate pulse referred to as the LED gate is supplied from a fifth stage of the counter 24 to the decoding unit 34 over a line 38, so that an LED selected by the decoding unit 34 is fired only for the duration of the LED gate pulse on the line 38. Preferably, this duration is a relatively small period within each cycle of the highest frequency output signal supplied to the output lines 26, so that the LED's operate with a low duty cycle and have relatively high light output in relation to the average power consumed by the LED's. This increases the efficiency and reliability of the LED's. The output lines 32 are connected over lines 40 to a series of output terminals (not shown) which identify the address of the LED and the beam being energized at any given time. These terminals may be connected to a microprocessor or other computing apparatus as an input.

Two of the four lines 32 are also supplied to a set of group select gates 33 for selecting one or another of several groups of phototransistors 35 (four in the embodiment of FIG. 2). Of all of the phototransistors in the selected group, only one receives light from the LED which is energized at that time, so that the composite signal from a selected group of phototransistors reveals that the beam originated with the LED currently being energized is not interrupted. This signal appears on a line 42, which leads to the input of a threshold detector apparatus 44. A suitable threshold detector apparatus is described and claimed in the Carroll et al application for Dynamic Level Shifter filed concurrently herewith. When a signal is received on the line 42 which indicates that a beam has not been interrupted, the threshold device 44 produces a signal on a line 46. The line 46 is connected to the D input of the D flip-flop 48. The clock input of the D flip-flop is connected to the LED gate line 38, so that the flip-flop 48 is set at the trailing edge of the LED gate pulse on the line 38 if a non-interrupted beam signal has been received on the line 42. This sets the flip-flop 48 so that its $\overline{Q}$ output is low.

In its reset condition, the $\overline{Q}$ output of the flip-flop 48 is high and this is conveyed to the line 30 which causes the latching operation of the latch unit 28. This causes the output lines 32 of the latch unit 28 to manifest the address of the last LED which was energized subsequent to receipt of a non-interrupted beam signal on the line 42.

When a beam is interrupted, there is no signal produced on the line 46, and the flip-flop 48 is reset at the end of the LED gate pulse. It remains reset as long as that beam remains interrupted. This causes the latch unit 28 to remain latched at the address of the LED associated with the interrupted beam, and this address is made available to external devices over the line 40. The line 60 is also connected by way of the line 62 to an external device, to indicate that an X beam interruption has been recognized.

Since the latch unit 28 remains latched to the address of the LED associated with the interrupted beam, this LED is pulsed repetitively at the LED gate pulse time by one of the lines 36 until a non-interrupted beam signal is received on the line 42. Scanning then resumes until the next interrupted beam is found. The counter 24 runs continuously during this time. The output on the lines 40 continuously indicates the address of the LED associated with the interrupted beam, and the signal on the line 62 indicates that it is an interrupted beam.

The same apparatus is repeated for the Y beams, using the same counter 24. A separate latch unit 66 is provided for the Y beams. A separate threshold detector 68 is employed for the phototransistors associated with the Y beams, and a separate output flip-flop 70 is also provided for the Y beams. Output lines 72 from the latch unit 66 identify the address of an LED associated with an interrupted Y beam, and a signal from the flip-flop 70 on a line 74 indicates that the address is one of an interrupted beam. When both of the lines 62 and 74 are high, it signifies that X and Y beams have both been broken, and the coordinates of the two interrupted beams are available on the lines 40 and 72. The LED for the interrupted Y beam is repetitively pulsed, at the rate of the clock generator 20, as described above in connection with the X beam, and this continues until the beam is recognized as non-interrupted.

The continuous pulsing of the interrupted beams provides a different pulsing rate for interrupted beams than for non-interrupted beams. Until a non-interrupted beam is recognized, each beam is pulsed once for every sixteen cycles of the clock pulse generator 20 (assuming a touch input panel having sixteen X beams and sixteen Y beams). When a beam is interrupted, however, the interrupted beam is pulsed once during each cycle of the clock pulse generator 20, sixteen times higher than formerly. This provides a markedly increased ability of the apparatus to detect when a touch input has been terminated. This allows a touch input panel of the present invention to be used much more rapidly than conventional touch input panels, which cannot recognize the termination of a touch input until after as many as sixteen cycles of the clock pulse generator. The speed of operation achieved by the apparatus of the present invention makes it possible for an operator to make multiple inputs in a point mode by rapidly withdrawing and then repositioning his finger on the panel, and allows rapid finger motion in a stream mode, in which a succession of output coordinates is generated without lifting the finger or stylus from the panel. Because the movement of the finger away from the interrupted beam is recognized almost instantly, it is not necessary for the operator to withdraw his finger and wait for sixteen clock pulse cycles to go by before making another finger input.

As thus far described, the apparatus of FIG. 2 may be employed with the apparatus of FIG. 3, in which there is only one set of X beams and one set of Y beams. In the apparatus of FIG. 1, a second set of X beams is required for the auxiliary plane, and the apparatus associated with the second set of X beams will now be described.

The LED's of the auxiliary plane are connected in common with corresponding X LED's in the principal plane, directly from the X decode unit 34. The outputs of the phototransistors of the auxiliary plane are treated separately.

Driving the LED's of the principal and auxiliary X planes from the same decode unit 34 effectuates a savings of structure, and permits a construction in which only a small additional amount of structure is required for the auxiliary X plane.

A separate threshold detecting circuit 80 is provided for the auxiliary X phototransistors, and a flip-flop 82 is set by the trailing edge of the LED gate pulse when the detector 80 produces a signal indicating that a beam is broken in the auxiliary X plane. An AND-gate 84 is connected to the outputs of the flip-flops 48, 70 and 82, so that when they are all set, as when a finger or stylus has interrupted corresponding X beams and at least one Y beam, an output is produced indicating that a normal input is ready.

The X decode unit 34 operates to energize the LED's for both the principal and auxiliary X planes, so that corresponding beams in both planes are energized simultaneously. Since the X latch was last set following detection of an interrupted beam in the principal plane, only the interrupted beam in the principal plane and the corresponding beam in the auxiliary plane can be pulsed. When both of those beams are broken, the flip-flops 48 and 82 are both set, indicating that a finger has approached the panel normally as far as the X beams are concerned.

When a finger approaches the panel in a direction which does not intercept the same X beam in the principal and auxiliary planes, only the flip-flop 48 can be reset. The outputs of this and the flip-flop 82 are connected to two inputs of an exclusive OR-gate 86, the output of which is connected to an input of an AND-gate 88. The second input of the AND-gate 88 is connected to the output of the flip-flop 70, which is set when a Y beam is broken. When the AND-gate 88 is operated, a signal appears on an output line 90, signifying that a skew input is present. A skew input is one which breaks a Y beam, but does not break both of the X beams. This output line can be employed to trigger a message on the screen of the display device 11, indicating to the operator that he must place his finger or stylus more normal to the surface of the panel.

A counter 92 is provided for measuring the time difference between the arrival of a finger or stylus in the auxiliary and principal planes. It receives timing pulses through an AND-gate 94 from a timing clock pulse source 96, providing that a flip-flop 98 is set. The flip-flop 98 is set by a signal on the line 100 from a monostable multivibrator 102. The multivibrator 102 furnishes a signal in the line 100 for a short period after the flip-flop 82 is set, indicating that an object has arrived at the auxiliary plane. When the object arrives at the principal plane, the flip-flop 70 is set, and a short duration signal is produced by a second monostable multivibrator 104 on a line 106 to reset the flip-flop 98. Accordingly, the counter 92 counts pulses from the source 96 only for the period between interruption of the beam in the auxiliary plane up until interruption of the beam in the principal plane. The output of the counter is connected to a comparator 105 which compares the content of the counter with a value stored in a storage device 107. If the content of the counter is less than the value stored in the storage device 107, an output line 108 is energized, otherwise, an output line 110 is energized. The output line 110 activates a comparator 112, which compares the output of the counter 92 to the value stored in a second storage device 114. If the content of the counter is larger than the value stored in the storage device 114, a line 116 is energized and otherwise, a line 118 is energized. Accordingly, the outputs on lines 108, 116 and 118 indicate respectively that the time between interruption of the auxiliary and principal planes is less than T1, is between T1 and T2, and is greater than T2. The line 116 is connected to one input of an AND-gate 120, the other input of which is connected to the output of the AND-gate 84. The output of the AND-gate 120 indicates a normal input within the speed range specified by the time values T1 and T2. This output can be used to control selection of a program which can inform the operator, through the display panel, that the input is not recognized because the speed of movement of the finger or stylus was too fast or too slow. Alternatively, the several outputs on lines 108, 116 and 118 can select programs of operations which are suitable to inputs which are made rapidly, or slowly. In self-teaching devices, this may be especially significant, because instruction programs may be chosen in response to whether an input is delivered slowly and hesitantly, or rapidly, with certainty. The gate 120 can be connected through an OR-gate to the lines 108 and 118 instead of to the line 116, to discriminate against a range of velocities corresponding to the times T1 and T2.

The velocity discrimination available by the signals on the lines 108, 116 and 118 is usable to distinguish between valid inputs through the use of a stylus or finger, or through the accidental presence of another relatively large object, such as a moth, which is large enough to break beams in both the principal and auxiliary planes.

FIG. 5 is a functional block diagram of an alternative arrangement of the present invention having two separated X beam planes. This gives three distinct planes, with two X beam planes and one Y beam plane. In the apparatus illustrated in FIG. 5, the Y beam plane is interposed between the two X beam planes which are referred to as X1 and X2.

The counter 24 is connected to the latch unit 28 in the same manner as described in connection with FIG. 2, for the X1 plane. A separate latch unit 200 is provided for the X2 plane, and it is connected through a multiplexer unit 226 to a decode unit 202, which provides sixteen output lines for separately energizing the sixteen LED's of the X2 plane. Since separate latch units 28 and 200 are provided for the two X planes, they are capable of latching the address of two separate interrupted beams in the X1 and X2 planes, when they are intercepted by an object which is not moving normally to the panel. In this way, the interruption of the beam in either the X1 or X2 planes does not prevent the recognition of the interruption of a non-corresponding beam in the other plane.

Three threshold detection devices TD and three output flip-flops are provided 48, 70 and 82, just as in the apparatus of FIG. 2.

The output of the flip-flop 82 is connected through a monostable multivibrator 102 to set the flip-flop 98 and the output of the flip-flop 70 is connected through a monostable multivibrator 104 to reset the flip-flop 98. It causes the counter 92 to be counted up to a value corresponding to the time difference between beam interruptions in the X2 plane and the Y plane.

The monostable multivibrator 104 is also connected to set a flip-flop 204, which is reset by a multivibrator 206 energized by the flip-flop 48. While the flip-flop 204 remains set, an AND-gate 208 is activated to pass pulses from the timing clock source 96 to a counter 210. Accordingly, the counter 210 is counted up to a value corresponding to the time difference between interruption of beams in the Y plane and the X1 plane. The content of the two counters 92 and 210 is conveyed to a subtraction unit 212, the output of which is connected to a comparator 214 which compares the result of the subtraction with the value stored in a storage device 216. An output line 218 identifies the sign of the difference, which indicates whether the velocity is increasing or decreasing as an object approaches the panel, and two additional output lines 220 and 222 indicate whether the time difference is greater or less than the time difference stored in the storage device 216.

If it is desired to produce outputs responsive to the relative change in velocities as a finger or stylus approaches the panel, a dividing unit can be substituted for the subtraction unit 212, whereupon the result is not the difference between the times, but the relative length of the times. This result can be compared with a standard value stored in the storage unit 216, whereupon the signals on the output lines 220 and 222 indicate whether the change in velocity is above or below a specified value. The signal on the line 218 would be produced in response to a comparison with unity in a comparator (not shown) and would signify a condition of increasing or decreasing velocity.

The various outputs available from the apparatus of FIG. 5 can be used in the same manner as described in connection with the apparatus of FIG. 2, namely, to control selection of programs, in response to the observed conditions. In the apparatus of both FIG. 2 and FIG. 5, it is apparent that the counting, the subtraction or division, and the comparison can take place by suitable programming of a microprocessing unit or other computer, in which the storage devices 107, 114, 216, etc. are contained in the computer's memory unit.

In any arrangement in which multiple X beams are employed, it is preferable to place the LED's for one X beam plane and the phototransistors for the other X beam plane on a single side 14 of the opening 12. The other LED's and phototransistors would then be placed in corresponding positions on the other side 14 of the opening 12. In this way, there is less likelihood of interference between the LED's of one beam plane and the phototransistors of the other. When multiple Y beam planes are provided, a corresponding arrangement is also desirable for the same reason.

In FIG. 5, an AND-gate 224 has its three inputs connected to the outputs of the flip-flops 48, 82 and 70, and produces an output when all three flip-flops are set. Since the flip-flops 48 and 82 may be set due to the interruption of non-corresponding beams, the output of the gate 224 does not necessarily indicate a normal input, but does indicate that an input is ready, and that it is long enough to intercept all three beam planes. The presence of a normal input can be identified, however, by means of apparatus which will now be described.

The multiplexer 226 has two sets of inputs connected respectively to the outputs of the X1 latch 28 and the X2 latch 200. Its output lines 228 are connected to the X2 decode unit 202. A control line 230 is connected to the multiplexer unit 226 for selecting the output of the X1 latch 28 or the X2 latch 200 to be decoded by the unit 202. Normally, the multiplexer 226 selects the output of the X2 latch, and when it does, the flip-flops 48 and 82 can be set by the breaking of non-corresponding beams. When the condition of the multiplexer 226 is changed, however, to select the output of the X1 latch 28 for use in the X2 decode unit 202, corresponding beams in the X1 and X2 planes are pulsed simultaneously, and then the flip-flops 48 and 82 can be set only when corresponding beams are simultaneously interrupted. An AND-gate 232 has two of its three inputs connected to the outputs of the flip-flops 48 and 82 and its third input to the multiplexer control line 230. Thus, when the multiplexer 226 is caused to select the output of the X1 latch 28, the gate 232 is enabled and produces an output when both the flip-flops 48 and 82 are set. With the multiplexer control line 230 high, this can occur only when corresponding X beams are broken, so that the output signifies that the input finger or stylus is normal to the touch panel.

Reference will now be made to FIG. 6, in which an embodiment is illustrated which provides a means for counting the number of broken beams, and determining the center point of the object which is interrupting the beams. A clock pulse generator 20 is connected to a counter 24, and the counter 24 is connected to X and Y decode units 34 and 67, just as described above in relation to FIG. 2. The counter 24 produces an output on a line 311 at the end of each scan cycle. Since the apparatus provided for the Y beams is identical to that provided for the X beams, it will suffice to describe only the apparatus associated with the X beams, it being understood that this structure is duplicated for the Y beams.

The threshold detector 44 is connected to the flip-flop 48. The flip-flop 48 is reset when a beam is interrupted as has been described above. Its output on the line 60 is connected to the set input of an RS flip-flop 302, which is set as the first interrupted beam is detected during each scan. A line 304 is connected to its reset input, and it is provided with a pulse on the line 311 at the end of each scan cycle for resetting it preparatory to a subsequent cycle of operation. The output of the flip-flop 302 is connected to the latch input of the latch 306, so that the output of the counter 24 is latched to identify the first interrupted beam, when the first interrupted beam signal is received at the input of the flip-flop 48.

The output of the flip-flop 48 is also connected to a gate 308 which receives LED gate pulses at its other input. The output of the gate 308 is connected to the input of a counter 312 which is reset by a pulse on a line 311 at the end of each scan cycle. Accordingly, the counter is reset to zero during the early portion of the scan cycle, and begins to count the LED clock pulses following resetting of the flip-flop 48, and is incremented to a content of unity on the second interrupted beam. The counter 24 continues to be incremented by the clock pulse generator 20, so that the decoder 34 continues to energize successive beams, after the first interrupted beam is detected. For each additional beam which is intercepted, the gate 308 produces an output which is counted by the counter 312. When the first following uninterrupted beam is recognized, the flip-flop 48 is set, and an input is applied from the line 60 through an inverter 314 to the control input of a latch unit 316, whereby the content of the counter 312 is latched. The output of the inverter 314 is connected to one input of an AND-gate 318, the other input of which is connected from the Q output of the flip-flop 302. Since the flip-flop 302 is set following detection of the first interrupted beam, both inputs to the gate 318 are high for the first time when the last of the series of interrupted beams has been detected. Its output on a line 320 signifies the end of a series of interrupted beams. The line 320 is connected to the control input of a shift unit 322 which is adapted to receive the data stored in the latch 316 and shift it rightwardly one position, which results in the binary quantity being divided by two. It is then output on lines 324 which are connected to one input of an adder unit 326. The other input of the adder unit is connected to the output of the latch unit 306 by lines 328. The output of the adder appears on the lines 330, and represents the identification of the first interrupted beam (stored in the latch 306) increased by half the number stored in the counter 312. It thus identifies the midpoint of the sequence of interrupted beams which have been broken. It is possible by this means to attain very high resolution with the touch input panel by closely spacing the beams in the beam plane, even when the beams are broken by a finger which is large in width compared to the inter-beam spacing.

The outputs which are available from the apparatus of FIG. 6 are the identification of the center line of the finger or stylus (on the lines 330), an indication that the interrupted beam series has ended (on the line 320), and an indication that the X beam has been broken (on the line 60). These signals may be used as interrupt and data signals for a microprocessor, to enable the microprocessor to receive and process the information. Since a duplicate structure is provided for the Y axis, it is convenient to provide an AND-gate similar to the AND-gate 84 of FIG. 2 to indicate that an input is ready when both the X and Y operations have been completed, such input identifying the X-Y coordinates of the center point of the interrupting object. The signal may be produced by anding the line 320 with the corresponding output line for the Y beams.

It will be apparent that in the apparatus of FIG. 6, it is necessary to continue scanning the X beams after the first interrupted beam is detected, in order to count the total number of interrupted beams. In the apparatus of FIG. 6, the counting continues for a full cycle, so that the increased pulsing speed of beams detected as having been interrupted, described in connection with FIG. 2, is not a feature of FIG. 6. The apparatus of FIG. 6 can be modified, however, to enable the direction of scanning to reverse when the total number of interrupted beams have been scanned, to improve the speed of operation of the apparatus. Such a modification is shown in FIG. 7.

In the apparatus of FIG. 7, the clock pulse generator 20 is connected to two separate counters 352 and 354 for the X and Y beams. Both counters are up-down counters, and the direction of counting is separately controlled by a control line in each case. The control line for the X counter 352 is the line 353.

The clock pulse generator 20 counts the counter 352 upwardly, via a frequency divider 355, which produces the LED gate pulses. The content of the counter is decoded by the X decoder 34 to energize the LED's for the X beams. The output of the phototransistors is connected to the X threshold detector 44, and operates the flip-flop 48. This much of the operation is similar to that which has been already described above. The $\overline{Q}$ output of the flip-flop 48 is connected to the toggle input of a flip-flop 358. This sets the flip-flop 358 and causes the latch unit 306 to be latched to hold the address of the interrupted beam.

A gate 360 is connected to the $\overline{Q}$ output of the flip-flop 48 and to the LED gate pulses for causing the counter 312 to count the number of interrupted beams. It receives a third input from the Q output of a flip-flop 361. The function of the flip-flop 361 is to control the direction of counting of the counter 352. This output is high when the counter is counting upwardly in its normal direction, so that the counter 312 is enabled to count the interrupted beams which are encountered after the first interrupted beam, while the counter is counting in its normal upward direction.

The Q output of the flip-flop 48 is connected to the toggle input of the flip-flop 361. The Q output of the flip-flop 48 goes high when the first non-interrupted beam is encountered following a series of interrupted beams, and this causes the flip-flop 361 to be reset.

The resetting of the flip-flop 361 disables the counter 312 and causes the counter 352 to begin to count downwardly, and therefore again scans the interrupted beams in the reverse direction. When the first interrupted beam is reached, the flip-flop 48 is reset, and its $\overline{Q}$ output goes high. This output sets the flip-flop 358 to terminate the output ready signal. When all of the interrupted beams have been scanned, eventually, a non-interrupted beam will be reached, and at that time, the flip-flop 48 is set and its Q output goes high. This sets the flip-flop 361, to resume upward counting of the counter 352. The flip-flops 48, 358 and 361 are restored to their initial condition at the beginning of the scan. The $\overline{Q}$ output of the flip-flop 358 operates to reset the counter 312 over a line 313, preparatory to making a new count of the number of interrupted beams on the next successive scan. The output of the counter 312 is connected to the latch 316, which is operated by inverter 364, which receives its input from the Q output of the flip-flop 361. Accordingly, the latch 316 is operated after the full set of interrupted beams has been scanned and the flip-flop 361 is reset in order to cause the counter 352 to count downwardly. An AND-gate 366 has its inputs connected to the output of the inverter 364 and the Q output of the flip-flop 358 to identify that a count is ready. The content of the latch is preferably shifted by means of a shifter as shown in FIG. 6 and added to the data stored in the latch 306, in the manner described in connection with FIG. 6 to identify the center line of the operating finger or stylus. The flip-flops 358 and 361 are reset and set, respectively, by the pulse on the line 311 whenever the end of scan is reached, to insure that their operation remains synchronized.

The apparatus of FIG. 7 operates faster than that of FIG. 6, because it scans only the interrupted beams backwardly and forwardly and provides an output of the center line of the interrupting object during each upward scan. Although, in the apparatus of FIG. 7, the data which might be acquired during downward scans is ignored, it will be appreciated that the apparatus can be modified to make use of this data as well. Such a modification would involve latching in the latch unit 306 the highest address of an interrupting beam (at the end of the upward scan or beginning of the downward scan), resetting the counter 312 at the beginning of the downward scan, counting the number of interrupted beams during the downward scan, shifting the data stored in the counter at the end of the downward scan and subtracting it from the data in the latch 306 to arrive at the identification of the center line of the interrupted beam. It is apparent that other latches (not shown) may be provided for holding data so that valid outputs are available to an output device without any particular need for synchronization with the operation of the upward and downward scanning apparatus.

It will be appreciated that, in the arrangement of FIG. 7, similar structure is provided for the Y beams, and an AND-gate can be provided to and the data ready outputs of the X and Y circuits to identify when the X and Y coordinates of the center point of the interrupting object are available for read-out to an external device.

Referring now to FIG. 4a, a perspective diagram is illustrated of a plurality of active elements which may be either LED's or phototransistors, which are fabricated in the form of a single integrated structure, on a strip 378. Several or all of the elements may be fabricated as integrated circuits formed in a single semiconducting surface. A plurality of individually light-emitting areas 380 are provided in spaced relationship along the length of the device, and a plurality of pins 382 protrude from the bottom of the apparatus in order to enable easy mounting and replacement of the structure. The fabrication of plural LED's on a single structure makes it possible to control the accuracy of the spacing of the LED at the time of the manufacture of the LED units themselves, and substantially decrease the assembly operations required in construction of a touch panel apparatus.

Above the strip 378, a second strip 384 is positioned. It is formed of transparent plastic material, and it has a plurality of positive lenses 385 integrally molded thereinto, spaced apart by distances which correspond to the spacing of the LED's 380. The lenses 385 comprise convex surfaces on the upper surface of the strip 384, while the lower surface of the strip 384 is planar. The thickness of the strip is such that when it is laid directly on the strip 378, the lenses 385 are positioned relative to the LED's to allow for maximum focusing of the light emitted therefrom. The use of the lenses 385 in association with the LED effects a sufficient collimation so that the light from any one LED is principally focused on a single phototransistor. This makes it possible to select groups of spaced phototransistors since only one of each selected group is illuminated by the LED which happens to be energized at any one time. This avoids the necessity of energizing the LED's and phototransistors in single layers.

FIG. 8 is a diagrammatic illustration of a further embodiment of the present invention in which the touch panel mechanism is employed to monitor a space. A space 408 is indicated diagrammatically in FIG. 8, and it is surrounded in three separate planes by three rectangular, hollow housings 402, 404 and 406. The housings support light sources and photosensitive devices on opposite sides, to form crossed beam planes, in the same manner which has been described above in connection with touch input panels. In the embodiment of FIG. 8, however, no touchable panel per se is employed. The apparatus is used to monitor activity within the space 408. The space 408 may, for example, comprise an animal cage, in which case the apparatus of FIG. 8 is adapted to monitor the activity of an animal in the cage. The beams which are broken in the X and Y directions in all three planes can be observed to represent the profile of the animal within the space, distinguish between lying, sitting and standing attitudes of the animal, determine the horizontal position of the animal in the cage, and, in general, monitor its activity. The speed of movement of the animal in either the X or Y direction can be determined by noting the time difference between breaking of successive beams in the beam planes. This is effectively accomplished by scanning back and forth across the animal, with the apparatus of FIG. 7 or as modified to allow meaningful data to be generated scanning in both directions. The time difference between interruption of successive beams in a beam plane is determined by employing counters as in FIGS. 2 and 4, but triggering the counters on and off when successive beams become non-interrupted. The content of the counter is then inversely proportional to the velocity component transverse of the beam direction in the beam plane. When the direction of motion of the animal is not parallel to either set of beams, the speed of movement of the animal in any direction may be calculated by vector addition of the X and Y velocities.

In another application, the apparatus of FIG. 8 may be employed to monitor the activity of a child in a playpen or a crib. Although the space illustrated in FIG. 8 is square, the space 408 need not be square, if the beams in the cross beam planes are not equally spaced, or if more beams are provided in one set of cross beams than in the other. An arrangement with an unequal number of beams in the beam plane is easily accommodated by the apparatus of the present invention, by use of the set inputs 58,58' and 58" (FIG. 2) which enable the intercepted beam detecting flip-flops to be set externally, to ignore non-meaningful inputs which may be produced by the various threshold detectors.

The apparatus of FIG. 8 may also be used to monitor activity within a larger space, such as a room, where it may be desirable to maintain a record of movement of people, animals, or objects. The apparatus of FIG. 8 can also be employed to monitor movements within dangerous environments, in such a way as to prevent accidental injury. For example, when it is desired to monitor activity around a machine tool, such as a punch press, or other metal forming or metal cutting machine, the space 408 defines the space around the machine in which an operator can stand during operation of the equipment. The apparatus of FIG. 8 senses the position of the operator in relation to the machine, and may be used to inhibit operation of the machine when the operator or any part of the operator moves into a dangerous position. The housings 402, 404 and 406 are positioned in such a way that the dangerous positions of the machine are scanned, and it is apparent that they need not necessarily be stacked in parallel arrangement as shown in FIG. 8, if an angled relationship affords a better filling of dangerous areas with crossed beams. The presence of an operator's hand within a dangerous area is recognized by the coordinates of the beams which are interrupted, and apparatus is provided for disabling the machinery when the interrupted beams are recognized in these locations.

The apparatus of FIG. 8 may also be employed to grade or size objects which pass within the space 408. This can be accomplished by counting the total number of X beams broken by any one object, counting the total number of Y beams broken by any one object and multiplying these numbers together to get a result which is the function of the volume of an object which is entirely within the space scanned by the three planes of the apparatus of FIG. 8. Additional planes may be provided for greater resolution, if desired. For longer objects, the objects may be sized by moving through the space 408 with a uniform velocity. The cross sectional area of the object may be determined in any of the three planes, by calculating the product of the total number of X beams and Y beams which are broken, and integrating the cross sectional area by repetitive addition while the object is moving through the space 408. It is apparent that only a single plane of crossed beams is required for this application.

The logic circuit associated with the structure of FIG. 8 is illustrated in FIG. 9. The clock pulse generator 20 is employed for producing pulses which count up a counter 412 via a divider 355. The output of the counter is connected to a Y decode unit 414 and to an X decode unit 416, for decoding the content of the counter 412 and energizing one of a plurality of LED's or other light sources. Since the apparatus provided for the Y beams is identical to that for the X beams, a description of the apparatus provided for the X beams will suffice for both.

The housing 402 is shown in FIG. 9 in cross section, and it is seen that an LED 418 is contained within the hollow housing aligned with an aperture which has a collimating lens 420 superposed over it. Aligned with the LED 418 and the lens 420 is an aperture 422 in the opposite side wall of the housing 402, and a phototransistor 424 is positioned behind the aperture 422.

The housings 404 and 406 for the other two planes have a similar structure, but the central plane 404 has the position of its LED and phototransistor interchanged, to minimize interference between the LED's of one plane and the phototransistors of another. Corresponding LED's of all three planes are connected together so that no additional lines from the X decode unit 416 are required for any number of planes which may be provided.

Each of the three planes has its individual interrupted beam recognition flip-flop 434, 436 and 438, connected to its threshold detector, so that interruption of three corresponding beams in the three planes is independently recognized.

When a beam in the X3 plane is interrupted, the clock input to the flip-flop 434 resets the flip-flop and its $\overline{Q}$ output goes high, giving a high level signal on the output 440, indicating that the X3 beam has been interrupted. The line 440 is connected to the latch input of a latch unit 442 which has its data inputs connected to the output of the counter 412. Accordingly, the address of the LED associated with the interrupted beam in the X3 plane is latched in the latch unit 442 and is available as an output on lines 444. A gate 446 has its inputs connected to the $\overline{Q}$ output of the flip-flop 434 and its clock input. The gate 446 produces pulses which are counted in a counter 450. The counter 450 is reset by a reset pulse on a line 311 at the end of each scan cycle, and is counted up from zero to count the total number of successive beams in the X3 plane which are interrupted. This output is available on lines 452. Similar apparatus is provided for the output flip-flops 436 and 438 of the X2 and X1 planes, and the address of the first interrupted beam in these planes is available on lines 454 and 456, with the total number of sequential broken beams being available on lines 458 and 460. These various outputs are available to a CPU or other controlling device, which is adapted to select a specific program of operations. For example, if the cross sectional area, as seen in the three X beam planes, is to be calculated, the outputs of the three counters, which are available on the lines 452, 458 and 460, may be added. If the apparatus is designed to determine whether an object is in a certain defined space (such as an operator's hand in a dangerous area around a machine tool), an inspection can be made of whether the X coordinate of the dangerous location is within the ranges indicated by (a) the outputs 444, 454 and 456 indicating the addresses of the first interrupted beam in each plane, and (b) the outputs indicating the total number of sequential interrupted beams in the three planes. It is apparent that a microprocessor or other processing device can readily make this determination and issue an output signal which can halt operation of the machine when a dangerous condition is recognized.

The apparatus of FIG. 9 is also adaptable to control by an external computer, in which case the scanning means may be energized in any sequence defined by the computer's program. When this mode of operation is desired, the computer controls the voltage levels on lines 464 and 466. The lines 464 are data lines, for setting the counter 412 in response to a control signal on the line 466. When the line 466 is high, the counter 412 operates independently of the clock pulses produced by the generator 20 and the divider 355. When the line 466 goes high, the counter 412 loads the data from the lines 464. This causes the counter 412 to be set to the data provided by the computer on the lines 464, so that any desired beams can be chosen by providing the appropriate data on the lines 464. In this way, special programs may be executed to scan only areas of interest, such as dangerous positions around the machine tool, or other programs may be executed in which only the area occupied by a body or object is scanned, to reduce the response time of the apparatus. Such a program has been described in connection with FIG. 7. It is apparent that an MPU or other computer can be arranged to carry out, through software, the operations which are performed by the hardware described in connection with FIG. 7.

As described in the foregoing embodiments, the apparatus of the present invention is adapted to produce a stream of outputs corresponding to the beams which are interrupted at any given time. Under some circumstances, it is desirable to cause the apparatus to operate in a point mode, in which an output is produced identifying the X-Y coordinates of only the first pair of crossed beams which are intercepted. No other data is output until a condition is first recognized in which no beams are intercepted. This mode of operation is sometimes desirable, in connection with a touch panel, when it is desired for the operator to execute operations in which only points are permissible inputs.

An arrangement is illustrated in FIG. 10 in which the point mode or the stream mode may be selected. The threshold detectors for the X and Y planes are connected to the X and Y flip-flops 48 and 70 in the manner described above. The $\overline{Q}$ outputs of both flip-flops are connected to inputs of a gate 502 to generate an output ready signal on a line 504 when both flip-flops have been reset, indicating the presence of interrupted X and Y beams. The output of the flip-flop 48 is connected to the set input of a flip-flop 506 which functions to produce a signal which operates the X latch unit 28, making the address of the interrupted X beam available on the output 40. Similarly, the output of the flip-flop 70 is connected to the set input of a flip-flop 510, the Q output of which is connected to operate the Y latch 66 and make the address of the interrupted Y beam available on the lines 72. Once the flip-flops 506 and 510 have been set, they cannot be reset until a signal is available on the line 514. This signal is developed by a NOR-gate 516 connected to the outputs of the flip-flops 48 and 70, and resets the flip-flops through OR-gates 525 and 526. A pulse appears on the line 514 only when both of the flip-flops 48 and 70 have been set in response to recognition of a non-interrupted beam. Therefore, the finger or stylus must be withdrawn so that no beam is interrupted before the latches 28 and 66 can indicate a subsequent address.

When a stream mode is desired, a mode selector input 518 is brought low. This is connected to inputs of two NOR-gates 520 and 522, the outputs of which are connected through the OR-gates 525 and 526 to the reset inputs of the flip-flops 506 and 510. The other inputs of the NOR-gates 520 and 522 are connected to the Q outputs of the flip-flops 48 and 70. Accordingly, when the line 518 is low, the flip-flop 506 is reset immediately following recognition of a non-interrupted beam by the flip-flop 48. When this occurs, the output of the flip-flop 48 goes low, and the gate 520 produces a pulse which passes through the gate 525 to reset the flip-flop 506. Accordingly, the X latch 28 may be latched as soon as the next interrupted beam is recognized. The same operation occurs for the Y latch.

The circuit of FIG. 10 makes it possible easily to select a point mode of operation or a stream mode, so that either may be used, as desired.

FIGS. 4b and 4c show alternative arrangements for the integrated construction of active elements. In FIG. 4b, two rows 552 and 554 of active elements are fabricated on the same supporting surface 556, in spaced apart relationship. One row is made up of LED's and the other row is made up of phototransistors, to form half of the active elements needed for two spaced beam planes. In FIG. 4c, two sheets of transparent plastic material 384a and 384b are provided, separated by a spacer sheet 384c. The sheet 384c is formed of any convenient material, and positions the sheets 384a and 384b far enough apart so that the collimation effect of the lenses is enhanced as much as possible. The spacing of the lenses above the strip 378 is determined by the thickness of the sheet 384b.

The operation of the apparatus described herein is improved markedly by the use of variable threshold devices which adapt to ambient light conditions in enabling the detection of interrupted and non-interrupted beams. Such devices are described and claimed in our copending application entitled "Dynamic Level Shifter" filed of even data herewith, and the disclosure of which is hereby incorporated by reference hereinto. The use of the variable threshold devices makes the interlocking and space-monitoring operations of the present invention possible. With previous apparatus, the high and variable light levels encountered during such operations would effectively prevent collection of meaningful data.

While the present invention has been described above in relation to its discrimination against small objects, where operation of a touch input panel by finger or stylus is desired, it will be apparent that large objects can also be discriminated against. For example, if more than a given number of consecutive beams in any beam plane are interrupted, the interrupting object may be recognized as not a finger or stylus, and the input rejected.

The control logic described above has been described in most cases for positive logic, i.e., a positive-going pulse is required to execute the indicated function. It is apparent to those skilled in the art that pulses of opposite polarity may be obtained at substantially the same times by the use of inverters where required. Where clocked logical units are employed (such as synchronous counters instead of ripple counters) a suitable source of clock pulses may be provided as well understood in the art. All of the logic units illustrated and described are conventional commercially available units.

It will be appreciated by those skilled in the art that although the present invention is described in terms of beam planes, the various sets of beams are not necessarily aligned in a plane. In fact, when a curved surface such as a CRT is used as the display device of a touch input panel, the sets of beams are preferably curved to conform to the curved CRT surface. Moreover, the light beams referred to herein need not necessarily be beams of visible light, but may be any form of radiant energy, whether visible or invisible. For example, the energy may be invisible infrared energy.

In the foregoing, the present invention has been described such as to enable others skilled in the art to make and use the same without departing from the essential features of novelty involved. It will be apparent that various modifications and additions may be made without departing from the essential features of novelty, which are intended to be defined and secured by the appended claims.

What is claimed is:

1. A photoelectric input device having a housing defining an opening,
a plurality of light sources supported by said housing in a row along one side of said opening,
a plurality of light sources supported on said housing in a row along an adjacent side of said opening,
a plurality of photosensitive devices supported in a row along a third side of said opening, and
a second plurality of photosensitive devices supported on said housing in a row along the fourth side of said opening,
each of said light sources defining a beam with one of the photosensitive devices supported on the opposite wall of said opening, whereby said light sources and photosensitive devices define two sets of beams each defining a surface extending between different pairs of opposite sides of said opening,
means for mounting said light sources and said photosensitive device on said housing to produce said sets of beams in two separate surfaces, spaced apart along the direction normal to the plane of said opening, counting means for each of said sets for counting a number of interrupted beams in each set, and means for producing output signals indicating the number counted by each counter,
and means for sensing, independently, when each of said two sets of beams has one or more beams which is interrupted.

2. Apparatus according to claim 1, wherein said light sources and photosensitive devices are arranged in plural rows along each side of said opening.

3. Apparatus according to claim 1, wherein the beams of each set of beams are oriented generally parallel to each other.

4. Apparatus according to claim 1, including means responsive to interruption of one beam in one set and one beam in the other set for developing a signal indicating the difference in time between interruption of said two beams.

5. Apparatus according to claim 4, including means for defining a third set of beams defining a third surface spaced from said first and second surfaces, means for developing a signal when any beam in each of the three surfaces is interrupted, means for determining the difference in time between interruption of beams in the first and second sets, means for determining the difference in time between interruption of beams in the second and third sets, and means for comparing said two time differences for producing an indication of the change in velocity in the space defined by said first, second and third surfaces.

6. Apparatus according to claim 5, including subtraction means for subtracting one of said time differences from the other.

7. Apparatus according to claim 5, including dividing means for dividing one of said time differences by the other.

8. Apparatus according to claim 1, including a third set of beams defining a surface spaced from said first and second surfaces, the beams in said third set being aligned with the beams of said first set in a direction away from said opening, and means for determining when corresponding beams in the first and third sets are interrupted simultaneously.

9. Apparatus according to claim 8, including means for determining when non-corresponding beams in said first and third sets are interrupted simultaneously.

10. Apparatus according to claim 1, including means responsive to interruption of one beam of each of said sets for developing a signal indicating the average velocity of an object moving between said sets.

11. Apparatus according to claim 10, including means for developing a signal indicating that the average velocity between said first and second planes is within a specified interval.

12. Apparatus according to claim 10, including means for developing a signal indicating that the velocity of an object intercepting beams in said first and second planes is not within a specified interval.

13. Apparatus according to claim 1, including means for recognizing interruption of individual beams in either of said sets, and means for developing signals responsive to interrupted beams for indicating the profile of an object interrupting said beams in a plane normal to the parallel beams.

14. Apparatus according to claim 1, including means for recognizing an interruption of individual beams of either of said sets, and said counter for developing signals responsive to interrupted beams for indicating the profile of an object interrupting said beams in a plane normal to said beams.

15. Apparatus according to claim 1, said counter being responsive to interruption of beams in less than all of said sets of beams for producing signals indicative of the size of an interrupting object.

16. Apparatus according to claim 1, including means for energizing said light sources along said one side one at a time, and for energizing said light sources in said adjacent side one at a time, detecting means for detecting a signal in response to a beam which is interrupted at the time its light source is energized, and said counting means counting the number of beams in each set which are interrupted.

17. Apparatus according to claim 14, including means for developing signals responsive to a change in said profile.

18. Apparatus according to claim 1, including means responsive to interruption of beams in less than all of said sets of beams for producing signals indicative of the size of an interrupting object.

19. Apparatus according to claim 15, including means for inhibiting operation of said input device when one or more beams are interrupted by an object of predetermined size characteristics.

20. Apparatus according to claim 1, including output means for repetitively manifesting the locations of all of the intercepted beams in both of said sets.

21. Apparatus according to claim 20, wherein said housing supports light sources and photosensitive devices defining a plurality of sets of beams traversing a volume of space, and wherein said output means includes means for manifesting the locations of interrupted beams in all of said sets, whereby activity within said space may be monitored by data processing apparatus connected to receive said locations.

22. Apparatus according to claim 1, wherein each of said counting means counts the number of consecutive intercepted beams of a set.

23. Apparatus according to claim 16, including means for counting the number of consecutive interrupted beams in said set.

24. Apparatus according to claim 23, including means for developing a signal indicative of the center line of an object which interrupts more than one beam of said set.

25. Apparatus according to claim 24, wherein said photoelectric input device has means for defining a second set of beams oriented in crossed relationship to said first set, second counting means for counting the number of consecutively interrupted beams of said second set, and means responsive to said second counting means thereto for developing a signal indicative of the center line of said object relative to the second set of beams.

26. Apparatus according to claim 24, including a second set of beams oriented in crossed relationship with said first set, means for counting the number of consecutive beams in said second set which are interrupted by said object, and means for developing signals representative of the area of an object in a plane parallel to the planes of said first and second sets by multiplying the number of interrupted beams of one set by the number of interrupted beams of the other set.

27. Apparatus according to claim 24, including a second set of beams, the beams of said first and second sets being oriented generally parallel to each other, with the beams of said first and second sets defining two spaced-apart surfaces, means for counting the number of consecutive beams which are interrupted by an object in each of said first and second planes, and calculating the cross sectional area of said object in a plane normal to both sets of beams by developing a signal indicative of the total number of interrupted beams in both sets.

* * * * *